(12) United States Patent
Segroves et al.

(10) Patent No.: US 10,356,935 B2
(45) Date of Patent: Jul. 16, 2019

(54) SEISMIC KIT FOR DYNAMIC CABINET

(71) Applicant: Panduit Corp., Tinley Park, IL (US)

(72) Inventors: Roger D. Segroves, Lockport, IL (US);
Alex C. Brouwer, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 15/976,295

(22) Filed: May 10, 2018

(65) Prior Publication Data

US 2018/0338385 A1    Nov. 22, 2018

Related U.S. Application Data

(60) Provisional application No. 62/507,959, filed on May 18, 2017.

(51) Int. Cl.
*A47B 91/02* (2006.01)
*H05K 7/14* (2006.01)

(52) U.S. Cl.
CPC ......... *H05K 7/1495* (2013.01); *A47B 91/026* (2013.01)

(58) Field of Classification Search
CPC ........ A47B 91/02; A47B 91/026; H04Q 1/03; H04Q 1/09; H04Q 1/10; H04Q 1/025; H04Q 1/062; H04Q 1/066; H04Q 1/112; H04Q 1/116; H05K 7/14; H05K 7/186; H05K 7/1495; H05K 9/0007; H05K 9/0062; H05K 13/00
USPC ................... 174/520, 350; 211/183; 361/818
See application file for complete search history.

(56) References Cited

U.S. PATENT DOCUMENTS

| | | | |
|---|---|---|---|
| 4,987,708 A | * | 1/1991 | Wilcox ................. E04B 1/0007 52/126.6 |
| 5,310,156 A | | 5/1994 | Matsumura et al. |
| 5,875,601 A | | 3/1999 | Gutelius, Jr. et al. |
| 6,059,251 A | | 5/2000 | Gutelius, Jr. et al. |
| 6,076,326 A | | 6/2000 | Gutelius, Jr. et al. |
| 6,134,858 A | | 10/2000 | Gutelius, Jr. et al. |
| 6,293,637 B1 | | 9/2001 | Anderson et al. |
| 6,425,488 B1 | | 7/2002 | Notohardjono et al. |
| 6,425,648 B1 | | 7/2002 | Notohardjono et al. |
| 6,511,282 B2 | | 1/2003 | Notohardjono et al. |
| 6,831,225 B2 | | 12/2004 | Chandler |
| 8,490,799 B2 | | 7/2013 | Knight et al. |

(Continued)

FOREIGN PATENT DOCUMENTS

WO    2006022600 A1    3/2006

OTHER PUBLICATIONS

1588B_Powerware_9155-Seismic_Kit_2005-2006.*
Google Search-Powerware 9155 UPS Seismic Kit.*

*Primary Examiner* — Timothy J Thompson
*Assistant Examiner* — Guillermo J Egoavil
(74) *Attorney, Agent, or Firm* — Christopher S. Clancy; James H. Williams; Aimee E. McVady (57) ABSTRACT

A cabinet installed in a data center is secured to the floor in the data center by a seismic kit to eliminate excessive deflection of the cabinet during a seismic event. The seismic kit includes a bracket and leveling leg clamps. The bracket is secured to the cabinet frame. The bracket has a first member and a second member with the second member extending upwards from the first member. The leveling leg clamps are secured to the first member of the bracket. The leveling leg clamps have a rectangular member with a cutout to receive leveling legs of the cabinet.

15 Claims, 7 Drawing Sheets

(56) References Cited

U.S. PATENT DOCUMENTS

| | | | |
|---|---|---|---|
| 8,925,739 B2 | 1/2015 | Crippen et al. | |
| 8,960,451 B2 | 2/2015 | Florence, Jr. et al. | |
| 9,532,484 B2 | 12/2016 | Franklin | |
| 2002/0172012 A1* | 11/2002 | Chandler | H02B 1/301 |
| | | | 361/724 |
| 2006/0043031 A1 | 3/2006 | Rinderer | |
| 2013/0194772 A1* | 8/2013 | Rojo | H04Q 1/112 |
| | | | 361/818 |
| 2014/0263129 A1 | 9/2014 | Tseng | |
| 2015/0002006 A1* | 1/2015 | Segroves | H05K 7/1491 |
| | | | 312/236 |
| 2015/0282349 A1 | 10/2015 | Mann et al. | |
| 2016/0016769 A1* | 1/2016 | Embleton | B66F 9/00 |
| | | | 254/9 R |

* cited by examiner

SEISMIC KIT FOR DYNAMIC CABINET

CROSS REFERENCE TO RELATED APPLICATIONS

This application claims priority to U.S. Provisional Application Ser. No. 62/507,959, filed May 18, 2017, the subject matter of which is hereby incorporated by reference in its entirety.

FIELD OF THE INVENTION

The present invention relates to a cabinet, and more particularly to a seismic kit for a dynamic cabinet.

BACKGROUND OF THE INVENTION

A typical cabinet installation in a data center located in a seismic zone requires that the cabinet be secured to the floor of the facility. The cabinet needs to be secured so it can withstand significant forces not normally witnessed in typical non-seismic installations.

Thus, it is desirable to provide an improved seismic kit designed to be easily installed on a cabinet to secure the cabinet in a seismic zone.

SUMMARY OF THE INVENTION

A cabinet installed in a data center is secured to the floor by a seismic kit. The seismic kit includes a bracket and leveling leg clamps. The bracket includes a first member and a second member with the second member extending from the first member. The second member of each bracket is secured to the front frame or the back frame of the cabinet. The first member of each bracket is secured to the floor. The leveling leg clamps are secured to the first member and are positioned around the leveling legs extending from the cabinet. The seismic kit secured to the cabinet eliminates excessive deflection of the cabinet during a seismic event.

DETAILED DESCRIPTION

The seismic kit 50 of the present invention is installed on cabinets 20 in data centers located in seismic zones. The seismic kit 50 is bolted on the front and back of the cabinet frame which allows for simplicity during the cabinet placement process. The seismic kit 50 also assures a cabinet height flexibility which enables alignment during ganging of multiple cabinets. As described below, once a cabinet is placed in a desired location, the seismic kit 50 is installed on the cabinet and then secured to floor. The seismic kit 50 includes additional bracing to secure the cabinet 20 to eliminate excessive cabinet deflection during a seismic event.

Figure 1:
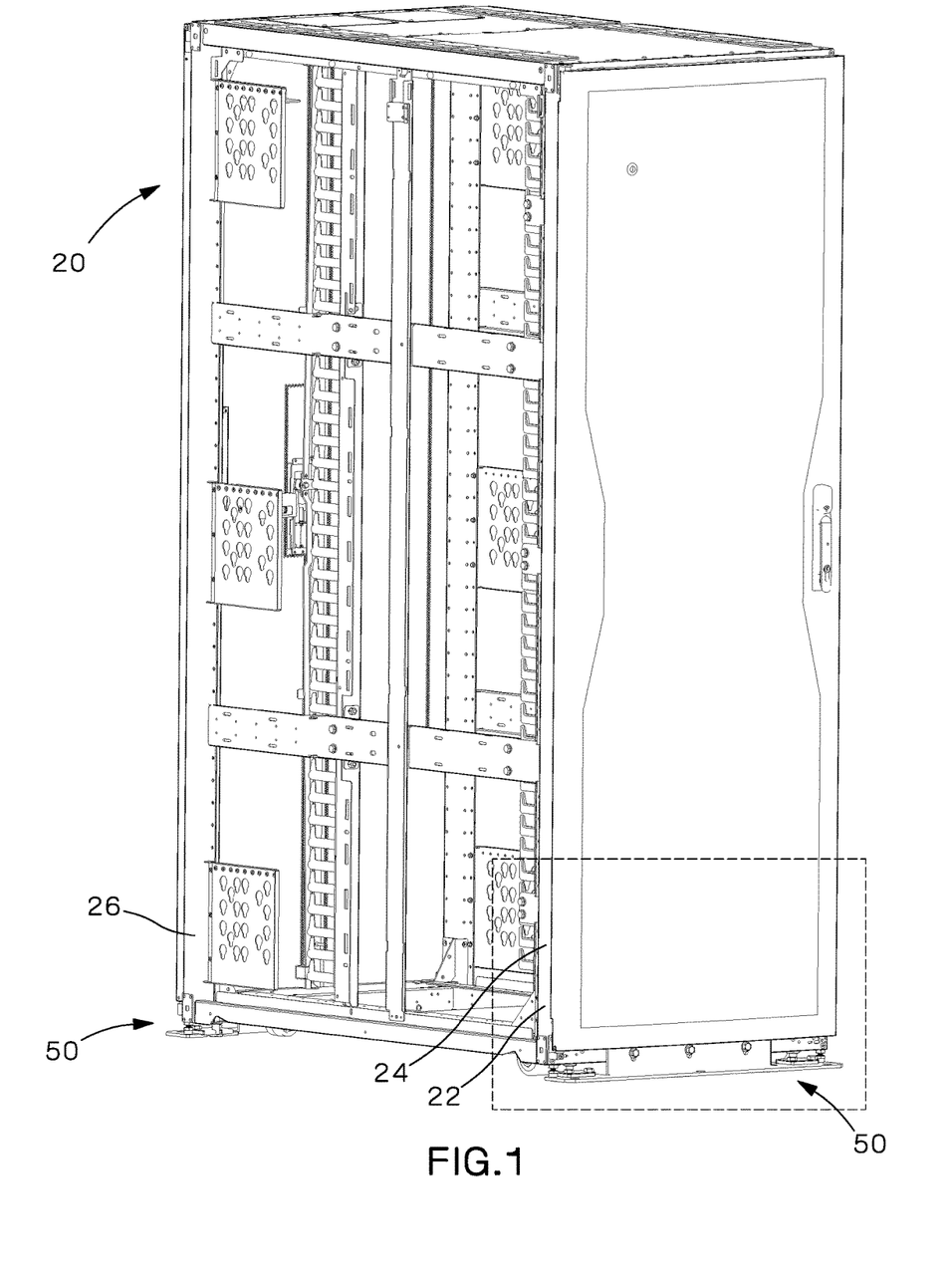
FIG. 1 is a perspective view of a cabinet with a seismic kit of the present invention installed on the front and back of the cabinet.
Figure 2:
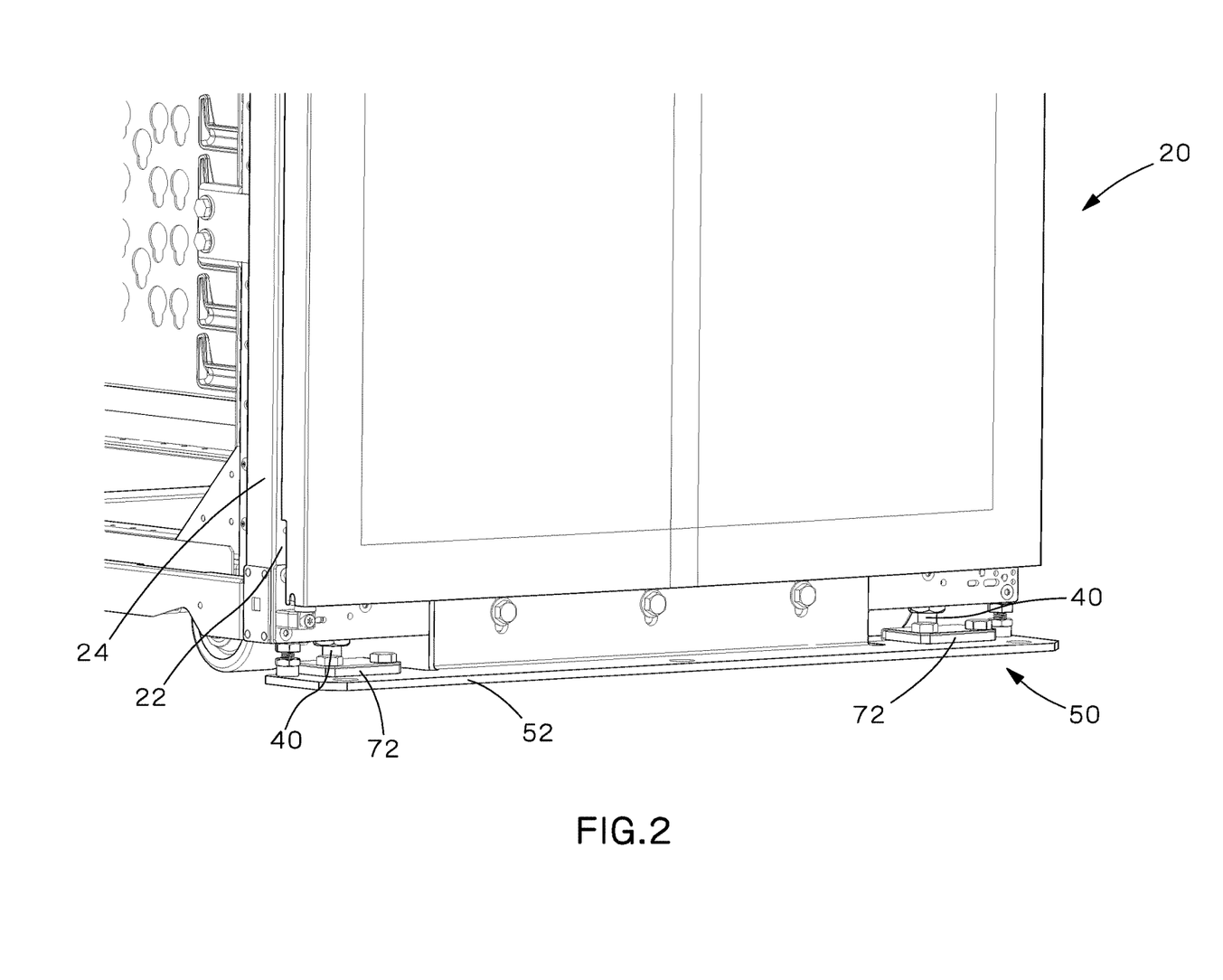
FIG. 2 is a front perspective view of the seismic kit installed on the front of the cabinet of FIG. 1.

FIG. 1 illustrates a dynamic cabinet 20 with the seismic kit 50 of the present invention secured on the front 24 of the cabinet 20 and the back 26 of the cabinet 20. FIG. 2 illustrates the seismic bracket 52 and leveling leg clamps 72 of the seismic kit 50 secured to the front 24 of the cabinet 20.

Figure 3:
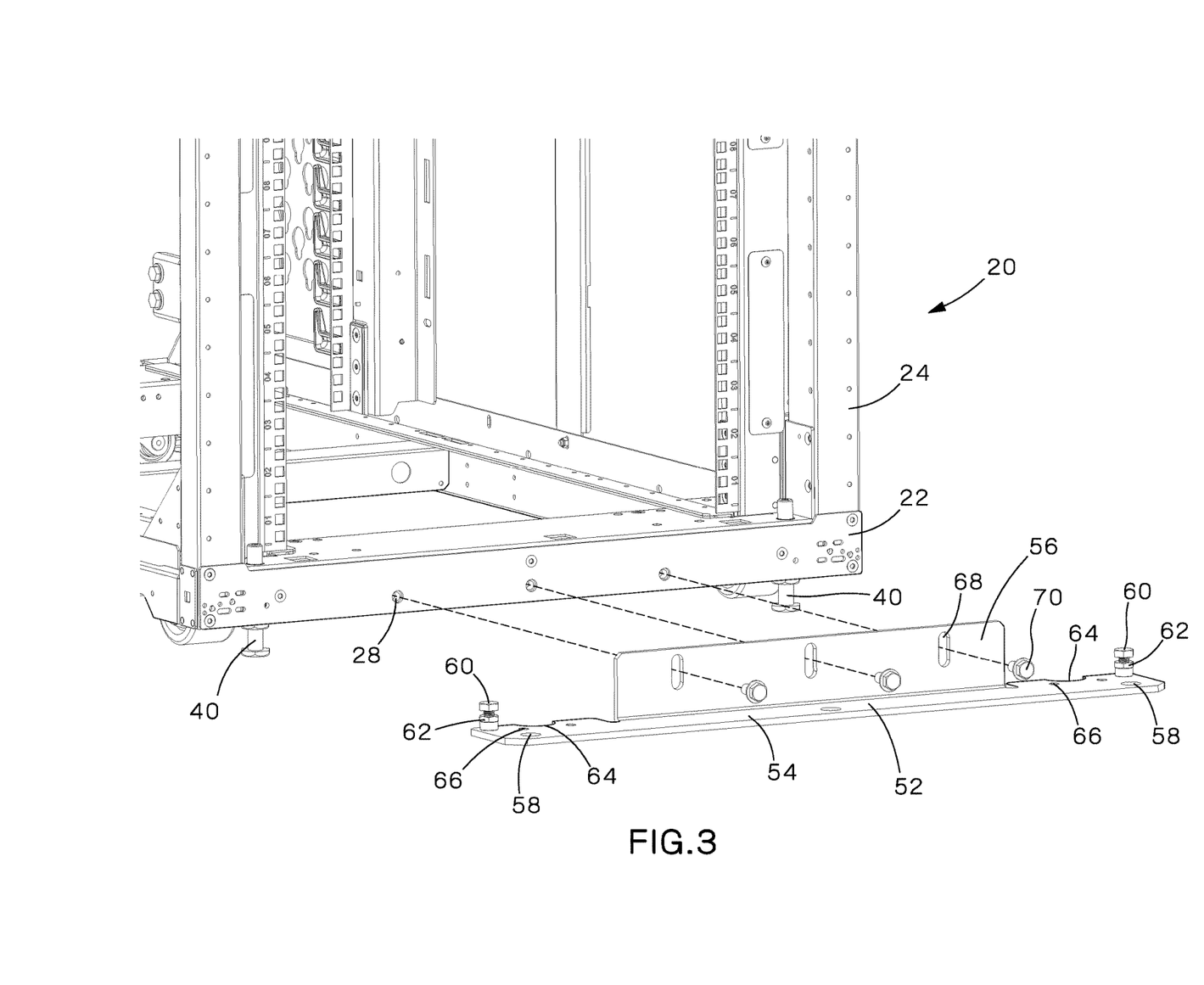
FIG. 3 is a front exploded view of the bracket of the seismic kit of FIG. 2 positioned to be installed on the front cabinet frame.

FIGS. 3-7 illustrate the assembly of the seismic kit 50. FIG. 3 illustrates a front 24 of the cabinet 20 with the door removed. The cabinet 20 includes a frame 22 with a plurality of threaded holes 28 along the bottom of the cabinet frame 22. The cabinet 20 also includes a leveling leg 40 located at each corner of the cabinet 20. Once the cabinet 20 has been placed in the desired location, the leveling legs 40 of the cabinet 20 are lowered to the floor to stabilize the cabinet 20 from moving. The leveling legs 40 also help to adjust the height of the cabinets 20 to that of adjacent cabinets, if necessary.

As illustrated in FIG. 3, the seismic bracket 52 includes a first member 54 and a second member 56. The first member 54 extends the width of the cabinet frame 22. The first member 54 includes a plurality of openings or holes 58 for receiving fasteners (not illustrated) to secure the first member 54 to the floor.

Each end of the first member 54 includes an exterior leveling foot 60. When the seismic bracket 52 is installed on the cabinet 20, each leveling foot 60 is positioned between the first member 54 and the bottom of the cabinet 20. Each leveling foot 60 is secured via jam nuts 62. The first member 54 also includes semi-circular cutouts 64 with holes 66 surrounding each semi-circular cutout 64. As illustrated and described with respect to FIGS. 5 and 7, each semi-circular cutout 64 receives one of the leveling legs 40 extending from the cabinet 20.

The second member 56 extends upwards from the first member 54 at the center of the first member 54. The second member 56 is perpendicular to the first member 54. The second member 56 includes a plurality of elongated slots 68 for receiving a mounting bolt 70 to secure the seismic bracket 52 to the cabinet frame 22.

Figure 4:
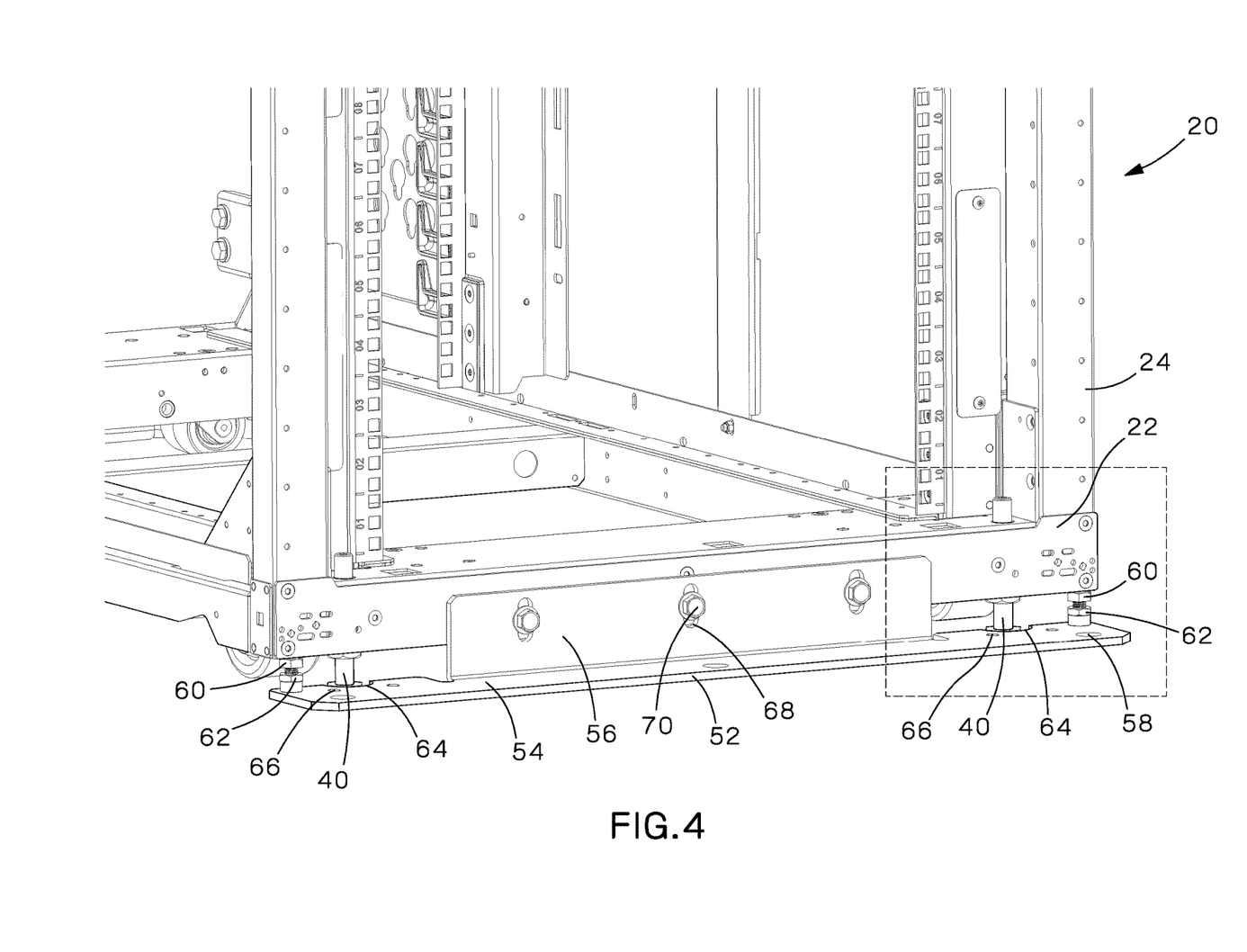
FIG. 4 is a front perspective view of the bracket of FIG. 3 installed on the front cabinet frame.

As illustrated in FIG. 4, the seismic bracket 52 is positioned adjacent to the front 24 of the cabinet frame 22. The semi-circular cutouts 64 of the first member 54 of the seismic bracket 52 surround the leveling legs 40 extending from the cabinet 20. The elongated slots 68 in the second member 56 of the seismic bracket 52 are aligned with the threaded holes 28 in the cabinet frame 22. Mounting bolts 70 secure the seismic bracket 52 to the cabinet frame 22. An identical seismic bracket 52 is also secured to the cabinet frame 22 at the back 26 of the cabinet 20.

Figure 5:
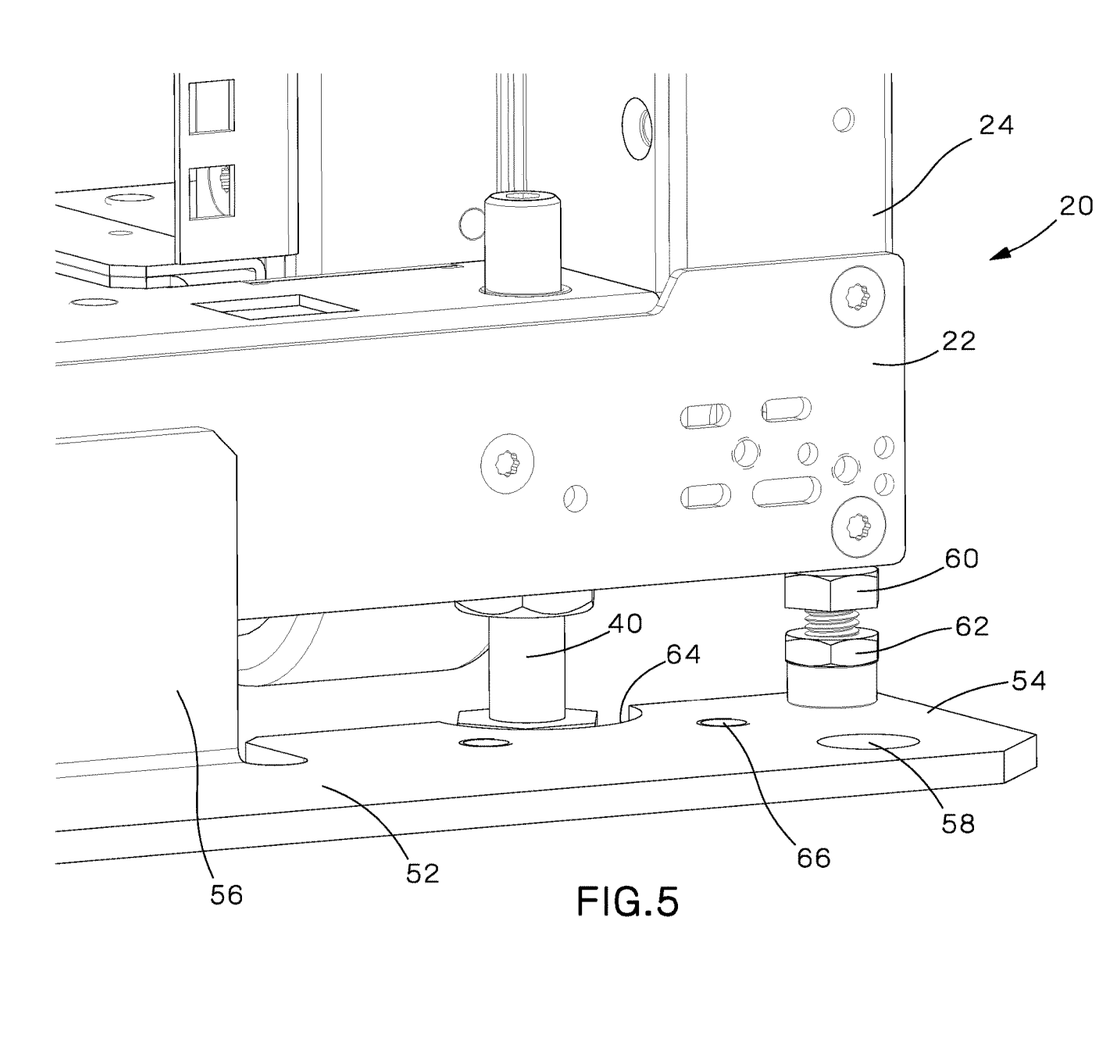
FIG. 5 is a front perspective view of one of the leveling feet of the seismic kit of FIG. 4.

After the seismic brackets 52 are secured, the exterior leveling feet 60 are raised to contact the outermost edges of the cabinet frame 22 (see FIG. 5). The jam nuts 62 are tightened to hold the leveling feet 60 in place. The leveling feet 60 reduce the ability of the cabinet frame 22 to sway during excessive side to side forces of a seismic event.

Figure 6:
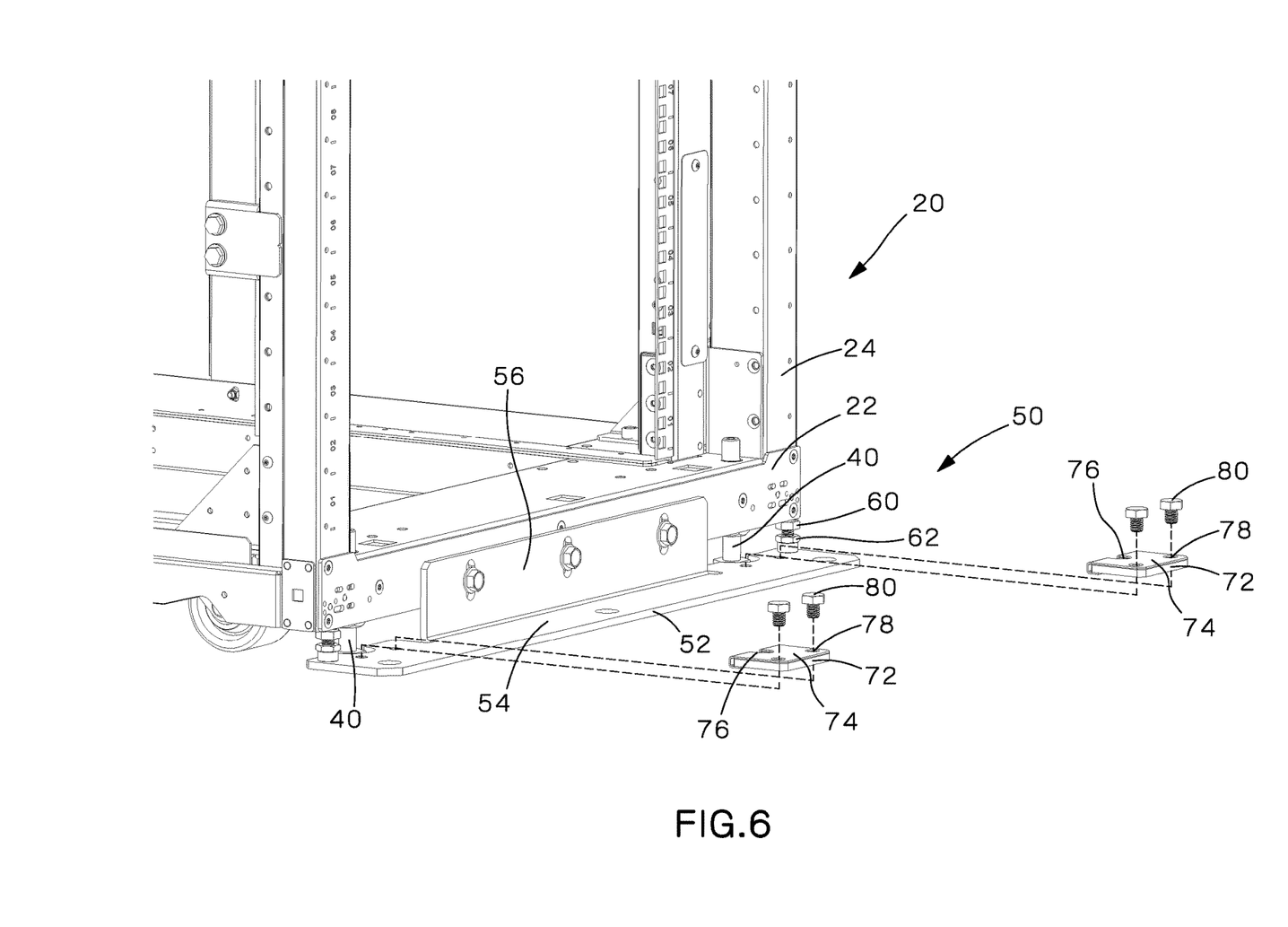
FIG. 6 is a front exploded view of the leveling leg clamps of the seismic kit positioned to be installed on the seismic bracket of FIG. 4.

FIG. 6 illustrates an exploded view of the leveling leg clamps 72 prior to being secured to the seismic bracket 52. The leveling leg clamps 72 include a rectangular member 74 with a semi-circular cutout 76 and openings or holes 78 for receiving fasteners, such as leveling leg clamp bolts 80. The leveling leg clamps 72 are positioned on the first member 54 of the seismic bracket 52. The semi-circular cutouts 76 of the leveling leg clamps 72 align with the semi-circular cutouts 64 of the first member 54 of the seismic bracket 52. The leveling leg clamp bolts 80 secure the leveling leg clamps 72 to the first member 54.

Figure 7:
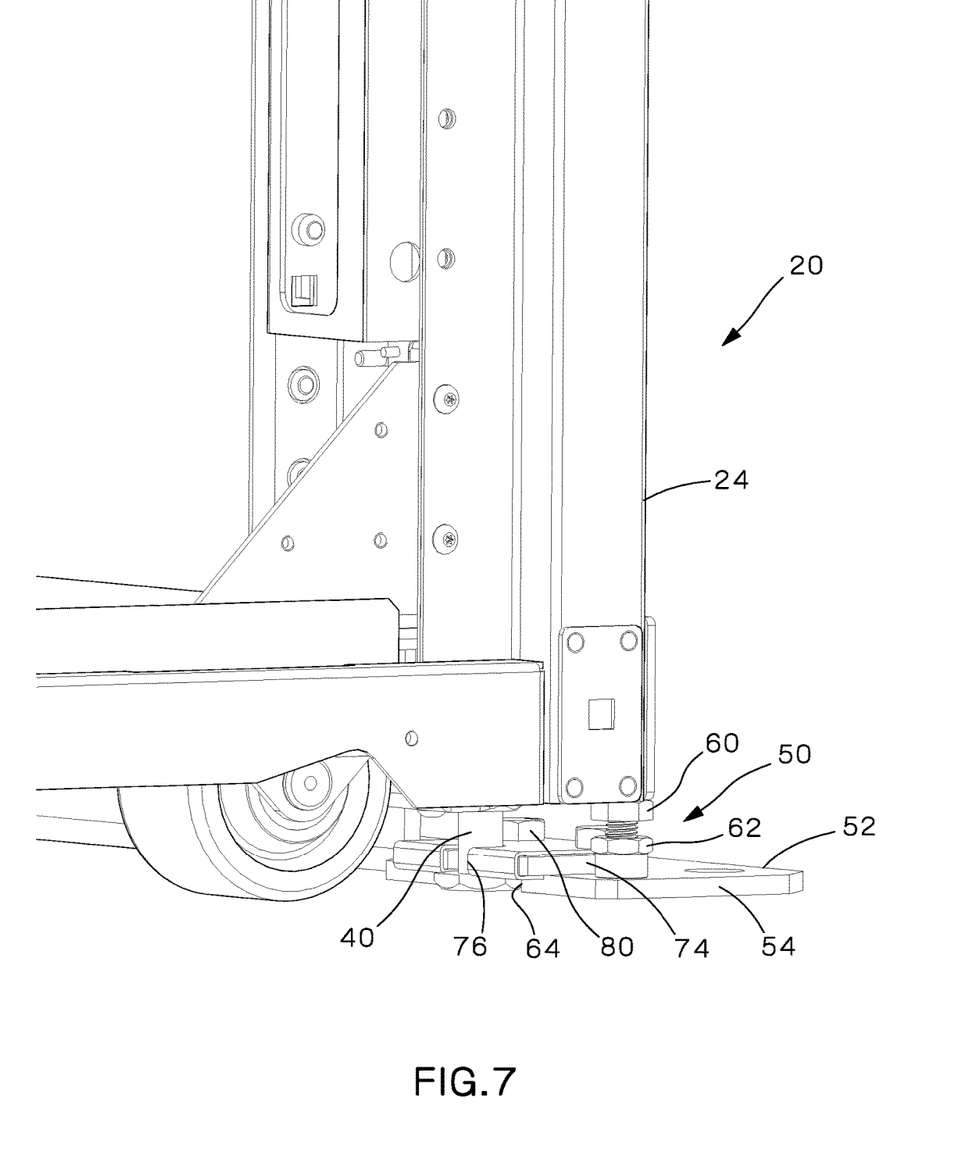
FIG. 7 is a rear perspective view of the complete seismic kit of FIG. 6 installed on the front of the cabinet.

As illustrated in FIG. 7, the aligned semi-circular cutouts 76, 64 of each leveling leg clamp 72 and the first member 54, respectively, receive one of the leveling legs 40 extending from the cabinet 20. Installing the leveling leg clamps 72 around the leveling legs 40 restrains the cabinet 20 from deflecting by reducing the vertical displacement of the leveling legs 40 due to side to side external forces.

Furthermore, while the preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

The invention claimed is:

1. A cabinet installed in a data center for maintaining electronic equipment, the cabinet comprising;
   a frame having a front and a back;
   at least one bracket secured to one of the front frame and the back frame; and leveling leg clamps secured to the at least one bracket;
   wherein the at least one bracket having at least one exterior leveling foot positioned at an end of the at least one bracket, once the at least one bracket is secured, the at least one leveling foot is raised to contact edges of the frame for reducing the ability of the frame to sway during a seismic event;
   whereby the at least one bracket is secured to a floor in the data center to eliminate excessive deflection of the cabinet during a seismic event.

2. The cabinet of claim 1, wherein the cabinet has four corners with a leveling leg extending from each corner.

3. The cabinet of claim 2, wherein the leveling leg clamps have a rectangular member with a cutout for receiving one of the leveling legs of the cabinet.

4. The cabinet of claim 1, wherein the at least one bracket having a first member and a second member, the second member extending upwards from the first member, wherein the second member is secured to the frame of the cabinet.

5. The cabinet of claim 4, wherein the first member having a plurality of openings for receiving fasteners to secure the first member to the floor.

6. The cabinet of claim 4, wherein the second member is perpendicular to the first member.

7. The cabinet of claim 4, wherein the second member includes a plurality of elongated slots for receiving fasteners to secure the at least one bracket to the frame of the cabinet.

8. The cabinet of claim 4, wherein the at least one bracket having cutouts in the first member for positioning the first member around leveling legs of the cabinet.

9. A seismic kit secured to a cabinet for eliminating cabinet deflection during a seismic event, the seismic kit comprising:
   a bracket having a first member and a second member, the second member extending upwards from the first member; and
   leveling leg clamps secured to the first member of the bracket, wherein the leveling leg clamps having a rectangular member with a cutout for receiving a leveling leg of the cabinet; and
   wherein the bracket having at least one exterior leveling foot positioned at an end of the bracket, whereby once the bracket is secured the at least one leveling foot is raised to contact edges of a cabinet frame for reducing the ability of the cabinet frame to sway during a seismic event.

10. The seismic kit of claim 9, wherein the first member having a plurality of openings for receiving fasteners to secure the first member to a floor.

11. The seismic kit of claim 9, wherein the second member is perpendicular to the first member.

12. The seismic kit of claim 9, wherein the second member includes a plurality of elongated slots for receiving fasteners to secure the bracket to a cabinet frame.

13. The seismic kit of claim 9, wherein the bracket having cutouts in the first member for positioning the first member around leveling legs of the cabinet.

14. A cabinet installed in a data center for maintaining electronic equipment, the cabinet comprising;
   a frame having a front and a back;
   at least one bracket secured to one of the front frame and the back frame and leveling leg clamps secured to the at least one bracket;
   wherein the at least one bracket having a first member and a second member, the second member extending upwards from the first member, wherein the second member is secured to the frame of the cabinet;
   wherein the at least one bracket having cutouts in the first member for positioning the first member around leveling legs of the cabinet;
   whereby the at least one bracket is secured to a floor in the data center to eliminate excessive deflection of the cabinet during a seismic event.

15. A seismic kit secured to a cabinet for eliminating cabinet deflection during a seismic event, the seismic kit comprising:
   a bracket having a first member and a second member, the second member extending upwards from the first member; and
   leveling leg clamps secured to the first member of the bracket, wherein the leveling leg clamps having a rectangular member with a cutout for receiving a leveling leg of the cabinet; and
   wherein the bracket having cutouts in the first member for positioning the first member around leveling legs of the cabinet.

* * * * *